US012580163B2

(12) United States Patent (10) Patent No.: US 12,580,163 B2
Usami et al. (45) Date of Patent: Mar. 17, 2026

(54) MEMBER FOR SEMICONDUCTOR MANUFACTURING APPARATUS

(71) Applicant: NGK INSULATORS, LTD., Nagoya-City (JP)

(72) Inventors: Taro Usami, Kakamigahara-City (JP); Tatsuya Kuno, Nagoya-City (JP)

(73) Assignee: NGK INSULATORS, LTD., Nagoya (JP)

(*) Notice: Subject to any disclaimer, the term of this patent is extended or adjusted under 35 U.S.C. 154(b) by 0 days.

(21) Appl. No.: 18/652,975

(22) Filed: May 2, 2024

(65) Prior Publication Data

US 2025/0125125 A1 Apr. 17, 2025

Related U.S. Application Data

(63) Continuation of application No. PCT/JP2023/036981, filed on Oct. 12, 2023.

(51) Int. Cl.
*H01J 37/32* (2006.01)

(52) U.S. Cl.
CPC ..... *H01J 37/32715* (2013.01); *H01J 37/3244* (2013.01)

(58) Field of Classification Search
CPC .......................... H01J 37/32715; H01J 37/3244
See application file for complete search history.

(56) References Cited

U.S. PATENT DOCUMENTS

| | | | | |
|---|---|---|---|---|
| 11,948,825 B2* | 4/2024 | Aikawa | ................... | H02N 13/00 |
| 2003/0099836 A1* | 5/2003 | Gandi | ................... | H05K 1/056 |
| | | | | 428/408 |

| | | | | |
|---|---|---|---|---|
| 2006/0196050 A1* | 9/2006 | Fujimori | ................. | F28D 1/035 |
| | | | | 29/890.035 |
| 2009/0159588 A1 | 6/2009 | Morioka et al. | | |
| 2015/0200337 A1* | 7/2015 | Denda | ..................... | H01L 24/26 |
| | | | | 361/709 |
| 2023/0207370 A1* | 6/2023 | Inoue | ................... | H01L 21/683 |
| | | | | 257/703 |

FOREIGN PATENT DOCUMENTS

| | | | |
|---|---|---|---|
| JP | 2009-087932 A | | 4/2009 |
| JP | 3154629 U | * | 10/2009 |
| JP | 3182120 U | | 3/2013 |
| JP | 2021-066757 A | | 4/2021 |

OTHER PUBLICATIONS

International Search Report and Written Opinion (Application No. PCT/JP2023/036981) dated Jan. 9, 2024 (6 pages).

* cited by examiner

*Primary Examiner* — Shawn M Braden
(74) *Attorney, Agent, or Firm* — BURR PATENT LAW, PLLC

(57) ABSTRACT

A member for semiconductor manufacturing apparatus includes: a ceramic plate having a wafer placement surface on an upper surface and a built-in electrode; a base plate provided on a lower surface of the ceramic plate, and configured to include built-in refrigerant flow paths; a through-hole that penetrates the base plate in an up-down direction; an insulating tube inserted into the through-hole; and a resin-containing adhesive layer provided at least one of between an upper surface of the insulating tube and a lower surface of the ceramic plate or between an outer circumferential surface of the insulating tube and an inner circumferential surface of the through-hole, and configured to fix the insulating tube. A thermal conductivity of the insulating tube is less than or equal to 10 W/mK.

13 Claims, 6 Drawing Sheets

Fig. 5A   [Thermal conductivity of insulating tube 30W/mK]

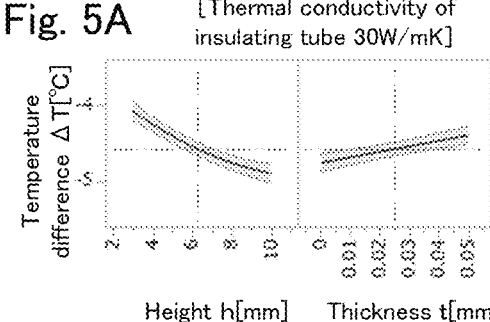

Height h[mm]          Thickness t[mm]

Fig. 5B   [Thermal conductivity of insulating tube 10W/mK]

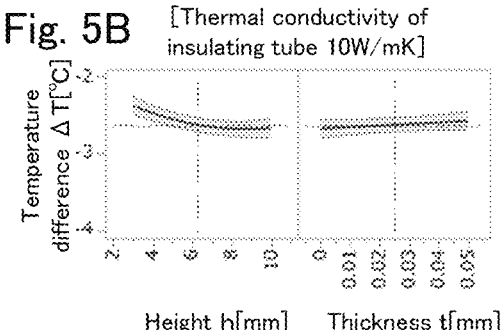

Height h[mm]          Thickness t[mm]

Fig. 5C   [Thermal conductivity of insulating tube 5W/mK]

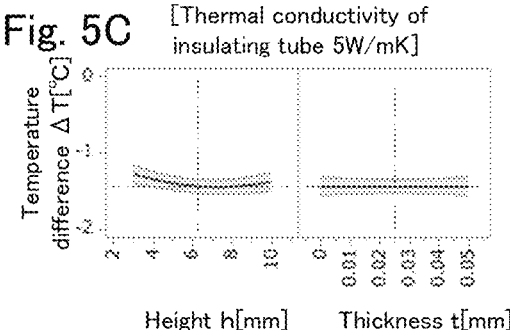

Height h[mm]          Thickness t[mm]

Fig. 5D   [Thermal conductivity of insulating tube 3W/mK]

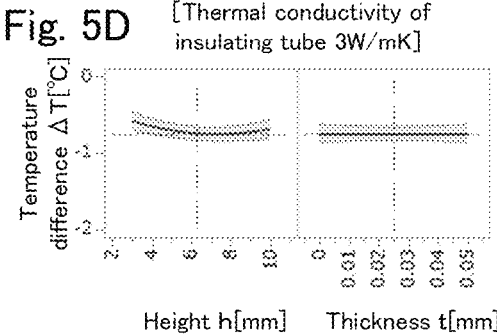

Height h[mm]          Thickness t[mm]

Fig. 5E   [Thermal conductivity of insulating tube 2W/mK]

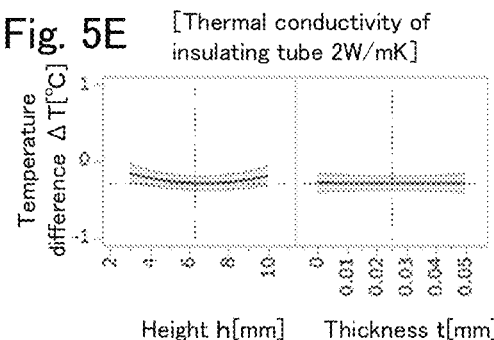

Height h[mm]          Thickness t[mm]

Fig. 5F   [Thermal conductivity of insulating tube 0.3W/mK]

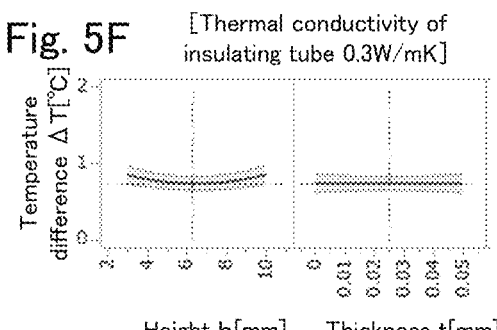

Height h[mm]          Thickness t[mm]

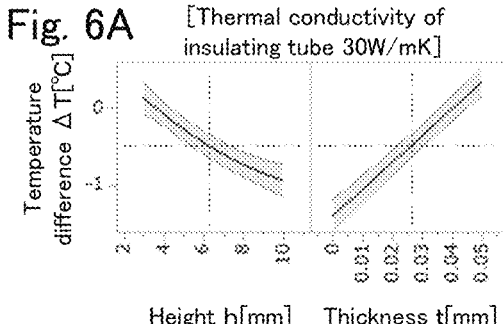
Fig. 6A  [Thermal conductivity of insulating tube 30W/mK]
Height h[mm]     Thickness t[mm]
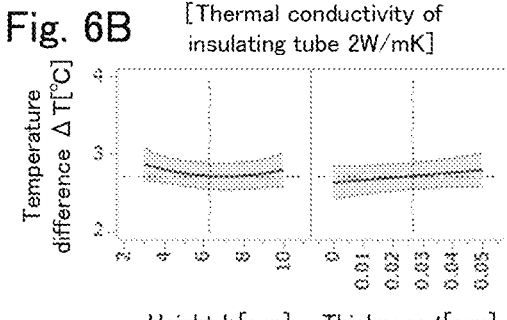
Fig. 6B  [Thermal conductivity of insulating tube 2W/mK]
Height h[mm]     Thickness t[mm]
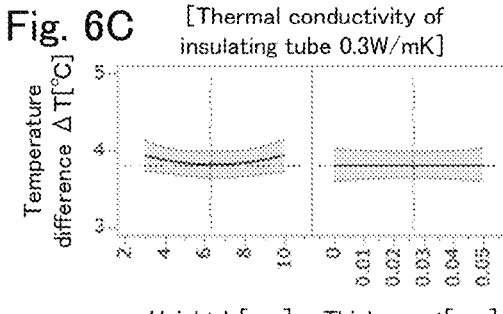
Fig. 6C  [Thermal conductivity of insulating tube 0.3W/mK]
Height h[mm]     Thickness t[mm]

MEMBER FOR SEMICONDUCTOR MANUFACTURING APPARATUS

BACKGROUND OF THE INVENTION

1. Field of the Invention

The present invention relates to a member for semiconductor manufacturing apparatus.

2. Description of the Related Art

Conventionally, members for semiconductor manufacturing apparatus have been known which include: a ceramic plate having a wafer placement surface at an upper surface and a built-in electrode; a base plate provided on the lower surface of the ceramic plate; a through-hole that penetrates the base plate in an up-down direction; and an insulating tube inserted into the through-hole. For example, PTL 1 discloses that an insulating tube made of alumina is fixed to a through-hole by an adhesive layer made of silicone resin in a member for semiconductor manufacturing apparatus.

CITATION LIST

Patent Literature

PTL 1: Japanese Registered Utility Model No. 3182120
(paragraph 0019)

SUMMARY OF THE INVENTION

However, when an insulating tube made of alumina is fixed to a through-hole by an adhesive layer made of silicone resin, the temperature of part of a wafer placement surface may vary with product, the part immediately above the central axis of the insulating tube.

The present invention has been devised to solve the above-mentioned problem, and it is a main object to prevent variation with product in the temperature of part of a wafer placement surface, the part immediately above the central axis of the insulating tube.

[1] A member for semiconductor manufacturing apparatus of the present invention includes: a ceramic plate having a wafer placement surface on an upper surface and a built-in electrode; a base plate provided on a lower surface of the ceramic plate, and configured to include built-in refrigerant flow paths; a through-hole that penetrates the base plate in an up-down direction; an insulating tube inserted into the through-hole; and a resin-containing adhesive layer provided at least one of between an upper surface of the insulating tube and a lower surface of the ceramic plate or between an outer circumferential surface of the insulating tube and an inner circumferential surface of the through-hole, and configured to fix the insulating tube, wherein a thermal conductivity of the insulating tube is less than or equal to 10 W/mK.

In the member for semiconductor manufacturing apparatus, the thermal conductivity of the insulating tube is less than or equal to 10 W/mK. Meanwhile, the thermal conductivity of the resin-containing adhesive layer which fixes the insulating tube is low because the resin-containing adhesive layer contains a resin. Thus, the difference between the thermal conductivity of the insulating tube and the thermal conductivity of the resin-containing adhesive layer is not significantly large. As a result, for example, even if the thickness (the length in an up-down direction) between the upper surface of the insulating tube and the lower surface of the ceramic plate of the resin-containing adhesive layer varies with product, or the amount of creep between the outer circumferential surface of the insulating tube and the inner circumferential surface of the through-hole of the resin-containing adhesive layer varies with product, variation in the temperature of part of the wafer placement surface depending on product can be prevented, the part being immediately above the central axis of the insulating tube.

In the present description, "upper", "lower" do not represent absolute positional relationship, but represent relative positional relationship. Thus, depending on the orientation of the member for semiconductor manufacturing apparatus, "upper" and "lower" may indicate "lower" and "upper", "left" and "right", or "front" and "back".

[2] In the member for semiconductor manufacturing apparatus (the member for semiconductor manufacturing apparatus according to [1]) of the present invention, the thermal conductivity of the resin-containing adhesive layer may be less than or equal to 5 W/mK. In this setting, the difference between the thermal conductivity of the insulating tube and the thermal conductivity of the resin-containing adhesive layer can be sufficiently reduced.

[3] In the member for semiconductor manufacturing apparatus (the member for semiconductor manufacturing apparatus according to [1] or [2]) of the present invention, the thermal conductivity of the insulating tube may be less than or equal to 10 times the thermal conductivity of the resin-containing adhesive layer. In this setting, the difference between the thermal conductivity of the insulating tube and the thermal conductivity of the resin-containing adhesive layer can be sufficiently reduced.

[4] In the member for semiconductor manufacturing apparatus (the member for semiconductor manufacturing apparatus according to any one of [1] to [3]) of the present invention, the thermal conductivity of the base plate may be less than or equal to 50 W/mK. In this setting, the effects of the present invention are easily obtained.

[5] In the member for semiconductor manufacturing apparatus (the member for semiconductor manufacturing apparatus according to any one of [1] to [4]) of the present invention, the insulating tube may be comprised of zirconia ceramic or PEEK.

[6] In the member for semiconductor manufacturing apparatus (the member for semiconductor manufacturing apparatus according to any one of [1] to [4]) of the present invention, the resin-containing adhesive layer may be comprised of a silicone resin.

[7] In the member for semiconductor manufacturing apparatus (the member for semiconductor manufacturing apparatus according to any one of [1] to [6]) of the present invention, the resin-containing adhesive layer may further contain a filler.

[8] In the member for semiconductor manufacturing apparatus (the member for semiconductor manufacturing apparatus according to any one of [1] to [7]) of the present invention, the base plate through-hole may be a power supply member insertion hole into which a power supply member to provide electric power to the electrode is inserted, the power supply member insertion hole being provided downward from the electrode in the member for semiconductor manufacturing apparatus, or part of a lift pin hole which penetrates the member for semiconductor manufacturing apparatus in an up-down direction, and into which a lift pin is inserted, or part of a gas hole that penetrates the member for semiconductor manufacturing apparatus in an up-down direction to supply gas to the wafer placement surface.

BRIEF DESCRIPTION OF THE DRAWINGS

FIGS. 5A to 5F are graphs showing the relationship between thickness t and temperature difference ΔT and the relationship between height h and temperature difference ΔT when the thermal conductivity of the insulating tube 50 is variously changed.

FIGS. 6A to 6C are graphs showing the relationship between thickness t and temperature difference ΔT and the relationship between height h and temperature difference ΔT when the thermal conductivity of the insulating tube 50 is variously changed.

DETAILED DESCRIPTION OF THE INVENTION

Figure 1:
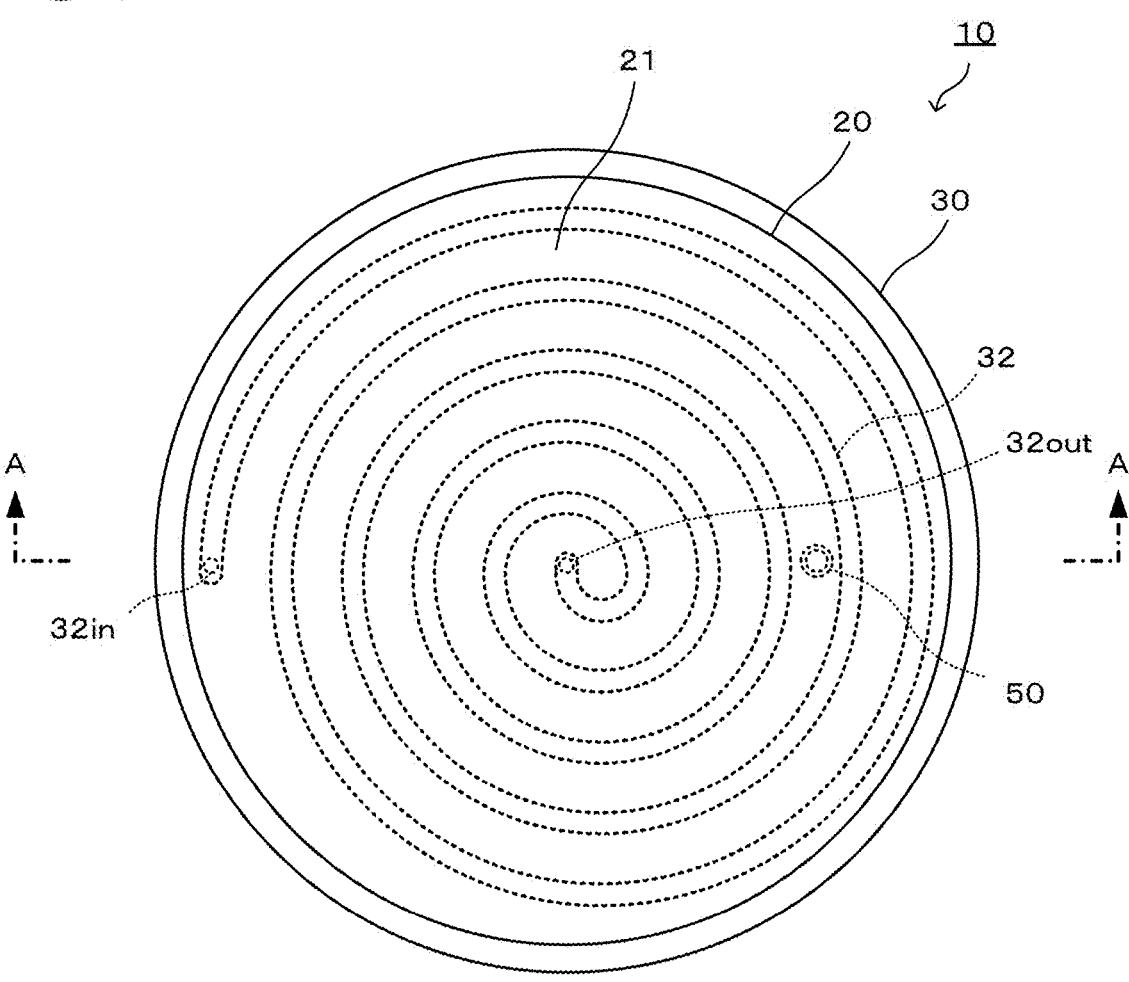
FIG. 1 is a plan view of a wafer placement table 10.

A preferred embodiment of the present invention will be described using the drawings. FIG. 1 is a plan view of a wafer placement table 10, FIG. 2 is an A-A cross-sectional view of FIG. 1, and FIG. 3 is a partially enlarged view (an enlarged view in the frame indicated by a two-dot chain line) of FIG. 2.

Figure 2:
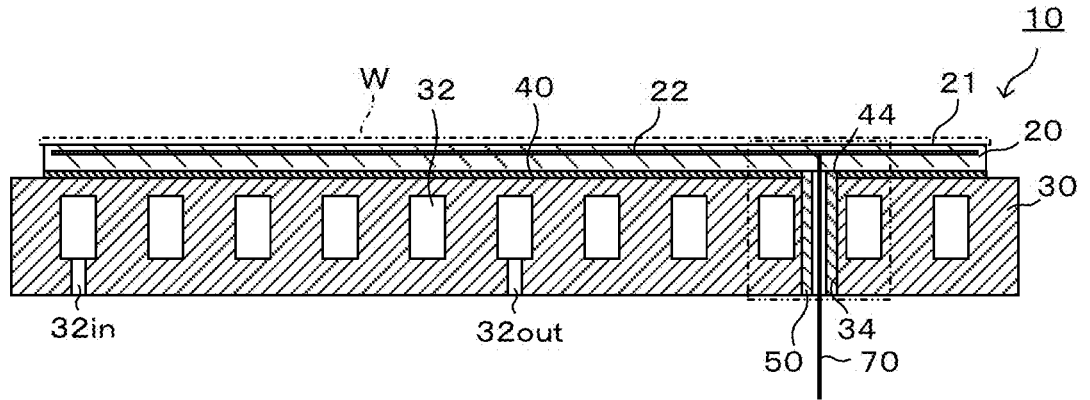
FIG. 2 is an A-A cross-sectional view of FIG. 1.
Figure 3:
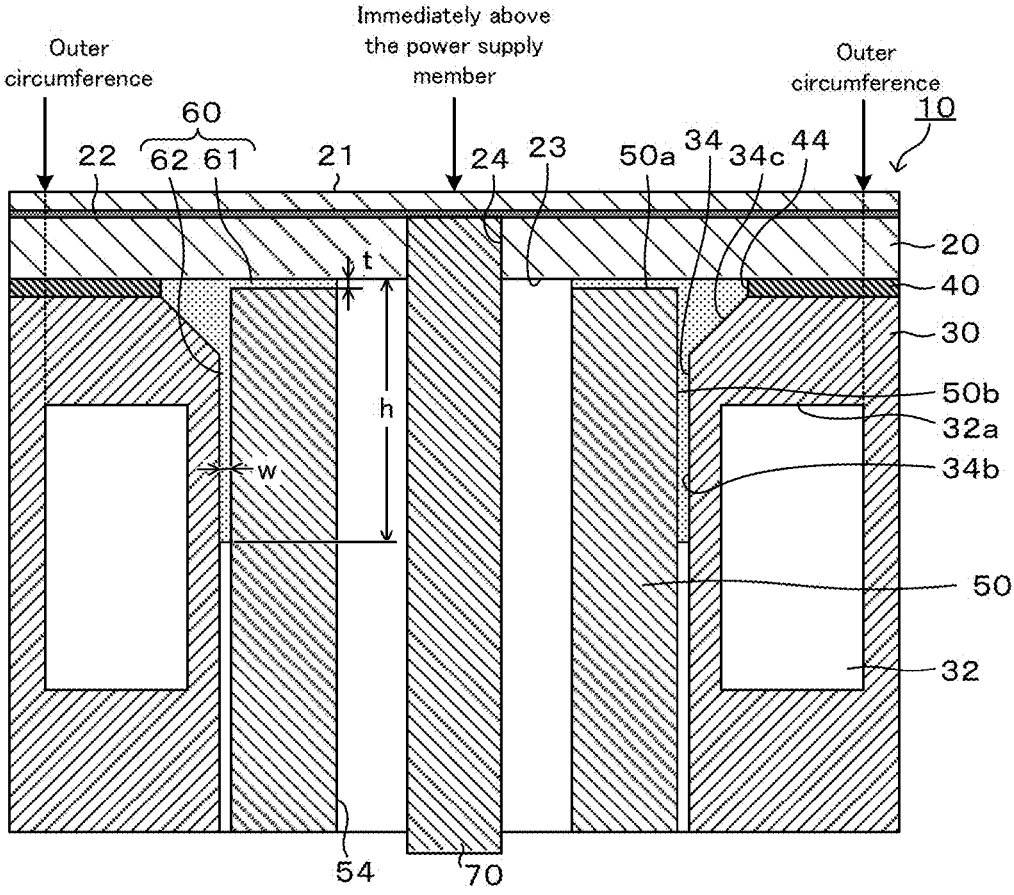
FIG. 3 is a partially enlarged view of FIG. 2.

The wafer placement table 10 is an example of a member for semiconductor manufacturing apparatus of the present invention, and as illustrated in FIG. 2, includes a ceramic plate 20, a base plate 30, a bonding layer 40, a base plate through-hole 34, an insulating tube 50, and a power supply member 70.

The ceramic plate 20 is a ceramic disk (e.g., a diameter of 300 mm, a thickness of 5 mm) such as an alumina sintered body or an aluminum nitride sintered body. The upper surface of the ceramic plate 20 is a wafer placement surface 21 on which wafer W is placed. The ceramic plate 20 has a built-in electrostatic electrode 22. Although illustration is omitted, an annular seal band is formed along the outer edge of the wafer placement surface 21 of the ceramic plate 20, and a plurality of small circular projections are formed on the entire inner region of the seal band. The electrostatic electrode 22 is a planar mesh electrode, and coupled to an external DC power supply (not illustrated) via a power supply member 70. When a DC voltage is applied to the electrostatic electrode 22, the wafer W is attracted and fixed to the wafer placement surface 21 by an electrostatic attraction force, and when the application of the DC voltage is stopped, the attraction and fixing of the wafer W to the wafer placement surface 21 is released.

The base plate 30 is a circular plate (e.g., a circular plate with a thickness of 25 mm and a diameter equal to or greater than the diameter of the ceramic plate 20) having good electrical conductivity and thermal conductivity. A refrigerant flow path 32, through which a refrigerant is circulated, is formed inside the base plate 30. The refrigerant which flows through the refrigerant flow path 32 is preferably liquid, and preferably has electrical insulating properties. As the liquid having electrical insulating properties, e.g., fluorine-based inert liquid may be mentioned. As illustrated in FIG. 1, the refrigerant flow path 32 is formed in a swirl shape over the entirety of the base plate 30 in a one-stroke pattern in a plan view from one end (inlet 32in) to the other end (outlet 32out). The inlet 32 in and the outlet 32out of the refrigerant flow path 32 are respectively coupled to a supply port and a collection port of an external refrigerant device which is not illustrated. The refrigerant supplied from the supply port of the external refrigerant device to the inlet 32 in of the refrigerant flow path 32 passes through the refrigerant flow path 32, then returns from the outlet 32out of the refrigerant flow path 32 to the collection port of the refrigerant flow path 32, undergoes temperature control, and is supplied again from the supply port to the inlet 32 in of the refrigerant flow path 32. The base plate 30 is coupled to a radio-frequency (RF) power supply, and is also used as an RF electrode.

As the material for the base plate 30, e.g., a metal material and a composite material of metal and ceramic may be mentioned. As the metal material, Al, Ti, Mo or an alloy thereof may be mentioned. As the composite material of metal and ceramic, a metal matrix composite material (MMC) and a ceramic matrix composite material (CMC) may be mentioned. As a specific example of such a composite material, a material containing Si, SiC and Ti (also referred to as SisiCTi), a material obtained by impregnating a Sic porous body with Al and/or Si, and a composite material of $Al_2O_3$ and TiC may be mentioned. As the material for the base plate 30, a material having a coefficient of thermal expansion closer to that of the material for the ceramic plate 20 is preferably selected. When the material for the ceramic plate 20 is alumina, the material for the base plate 30 is preferably pure Ti or α-β Ti alloy. This is because the coefficient of thermal expansion of pure Ti and α-β Ti alloy is close to the coefficient of thermal expansion of alumina. The base plate 30 may be comprised of a material having a thermal conductivity lower than the thermal conductivity of Al, and may be comprised of a material having a thermal conductivity lower than the thermal conductivity of the material (e.g., alumina) for the ceramic plate 20. As those materials, a Ti-containing material represented by e.g., pure Ti and α-β Ti may be mentioned. When the material for the base plate 30 is a Ti-containing material, the present invention is highly effective. The thermal conductivity of the base plate 30 may be 50 W/mK or lower, and may be 5 to 20 W/mK. For example, the thermal conductivity of pure Ti is 17 W/mK, and the thermal conductivity of α-β Ti is 7.5 W/mK. Note that the thermal conductivity of Al is 150 to 200 W/mK.

The bonding layer 40 is a resin adhesive layer herein, and bonds the lower surface of the ceramic plate 20 and the upper surface of the base plate 30 together. As the material for the resin adhesive layer, e.g., an insulating resin such as an epoxy resin, an acrylic resin, and a silicone resin may be mentioned. The bonding layer 40 may be an insulating resin containing a filler. The filler is preferably a material with a thermal conductivity higher than the thermal conductivity of the insulating resin of the bonding layer 40, and may be e.g., alumina or aluminum nitride.

The base plate through-hole 34 is a substantially cylindrical hole that penetrates the base plate 30 in an up-down direction, and is provided so as not to penetrate the refrigerant flow paths 32. The base plate through-hole 34 communicates with a bonding layer through-hole 44. The bonding layer through-hole 44 is a substantially cylindrical hole that penetrates the bonding layer 40 in an up-down direction.

The insulating tube 50 is stored in the base plate through-hole 34 and the bonding layer through-hole 44. The insulating tube 50 is a substantially cylindrical member comprised of an electrically insulating material (e.g., ceramic or resin), and has an insulating tube through-hole 54 that penetrates the insulating tube 50 in an up-down direction along the central axis of the insulating tube 50.

As illustrated in FIG. 3, the insulating tube 50 is bonded to the lower surface 23 of the ceramic plate 20 and the inner circumferential surface 34b of the base plate through-hole 34 via a resin-containing adhesive layer 60. The upper end of the base plate through-hole 34 is a tapered surface 34c which has a C chamfered shape. The resin-containing adhesive layer 60 includes: an insulating tube upper surface adhesion part 61 that bonds the lower surface 23 of the ceramic plate 20 and an upper surface 50a of the insulating tube 50 together; and an insulating tube outer circumferential surface adhesion part 62 that is continuous to the insulating tube upper surface adhesion part 61, and bonds the inner circumferential surface 34b of the base plate through-hole 34 and an outer circumferential surface 50b of the insulating tube 50 together. The insulating tube outer circumferential surface adhesion part 62 is provided from the lower surface 23 of the ceramic plate 20 to a position lower than the ceiling surface 32a of each refrigerant flow path 32. The thickness t (the length in an up-down direction) of the insulating tube upper surface adhesion part 61 is preferably e.g., 0.01 mm or greater and 0.1 mm or less. The height h (length in an up-down direction, or referred to as an amount of creep) of the insulating tube outer circumferential surface adhesion part 62 is preferably e.g., 3 mm or greater and 10 mm or less. The distance (length in a radial direction) w between the inner circumferential surface 34b (excluding the tapered surface 34C) of the base plate through-hole 34 and the outer circumferential surface 50b of the insulating tube 50 is preferably e.g., 0.1 mm or greater and 0.3 mm or less. As the material for the resin-containing adhesive layer 60, e.g., an insulating resin such as an epoxy resin, an acrylic resin, and a silicone resin may be mentioned. The resin-containing adhesive layer 60 may be an insulating resin containing a filler. The filler is preferably a material with a thermal conductivity higher than the thermal conductivity of the insulating resin of the resin-containing adhesive layer 60, and may be e.g., alumina or aluminum nitride. The resin-containing adhesive layer 60 may have a thermal conductivity higher than the thermal conductivity of the bonding layer 40.

The thermal conductivity of the insulating tube 50 is preferably less than or equal to 10 W/mk, more preferably, less than or equal to 5 W/mK. The thermal conductivity of the resin-containing adhesive layer 60 is preferably less than or equal to 5 W/mK, more preferably, less than or equal to 2.5 W/mK. The thermal conductivity of the insulating tube 50 is preferably less than or equal to 10 times the thermal conductivity of the resin-containing adhesive layer 60, more preferably, less than or equal to 15 times the thermal conductivity. The difference between the thermal conductivity of the insulating tube 50 and the thermal conductivity of the resin-containing adhesive layer 60 is preferably less than or equal to 5 W/mk, more preferably, less than or equal to 1 W/mK. As preferred combinations of the material for the insulating tube 50 and the material for the resin-containing adhesive layer 60, the combination of zirconia ceramic (with a thermal conductivity of 2 W/mK) for the insulating tube 50 and silicone resin (with a thermal conductivity of 2.2 W/mK) with filler (e.g., alumina) contained for the resin-containing adhesive layer 60, and the combination of PEEK (with a thermal conductivity of 0.3 W/mK)

for the insulating tube 50 and silicone resin (with a thermal conductivity of 0.2 W/mK) for the resin-containing adhesive layer 60 may be mentioned.

The power supply member 70 is e.g., a metal rod. The metal used for the power supply member 70 is e.g., W, Mo, Ni, and preferably has a coefficient of thermal expansion close to the coefficient of thermal expansion of the ceramic plate 20. As illustrated in FIG. 3, the power supply member 70 is inserted into the insulating tube through-hole 54 and a ceramic plate bottomed hole 24, and electrically connected to the electrostatic electrode 22 exposed to the ceramic plate bottomed hole 24 to supply electric power to the electrostatic electrode 22. The ceramic plate bottomed hole 24 is a substantially cylindrical hole provided from the lower surface 23 of the ceramic plate 20 to the electrostatic electrode 22, and is smaller than the insulating tube through-hole 54 in diameter. The power supply member 70 is electrically insulated from the base plate 30 by the insulating tube 50 disposed in the base plate through-hole 34 and the bonding layer through-hole 44. Note that the base plate through-hole 34, the bonding layer through-hole 44 and the ceramic plate bottomed hole 24 each correspond to a power supply member insertion hole of the present invention.

Subsequently, the process of bonding the insulating tube 50 in a method of manufacturing the wafer placement table 10 will be described using FIGS. 4A to 4D. FIGS. 4A to 4D are explanatory views of the process. Note that in FIGS. 4A to 4D, the wafer placement surface 21 of the ceramic plate 20 faces down. FIGS. 4A to 4D are partially enlarged views of the surroundings of the base plate through-hole 34.

Figure 4A:
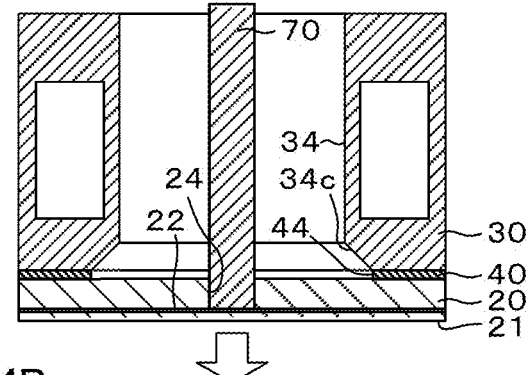
FIGS. 4A to 4D are explanatory views illustrating a bonding process for an insulating tube 50.
Figure 4B:
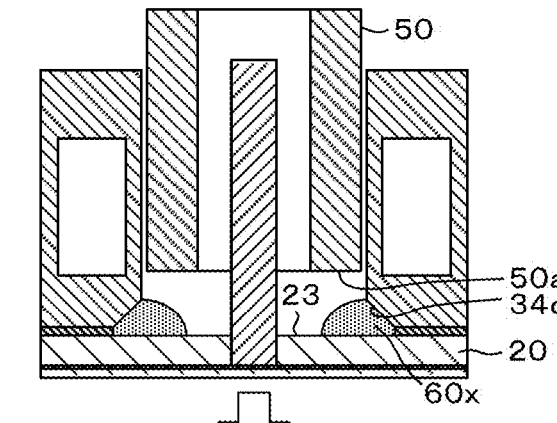
Figure 4C:
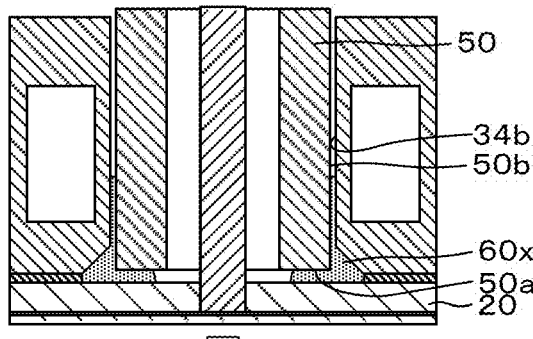
Figure 4D:
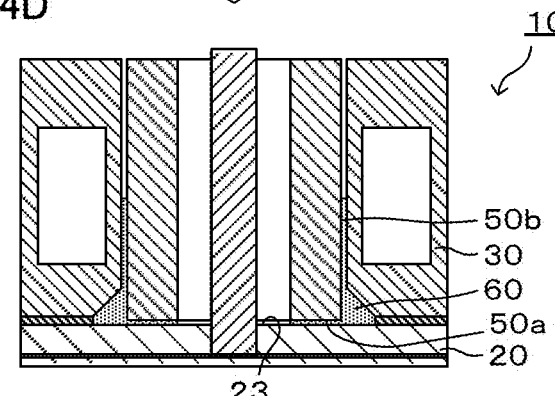

First, a bonded body obtained by bonding the ceramic plate 20 and the base plate 30 by the bonding layer 40 is prepared (FIG. 4A). In the bonded body, the electrostatic electrode 22 is embedded in the ceramic plate 20. In the bonded body, the power supply member 70 is inserted into the ceramic plate bottomed hole 24 through the base plate through-hole 34 and the bonding layer through-hole 44, and is electrically connected to the electrostatic electrode 22. Next, an adhesive agent 60x is disposed between the tapered surface 34c of the base plate through-hole 34 and the lower surface 23 of the ceramic plate 20, and the insulating tube 50 is inserted into the base plate through-hole 34 so that the upper surface 50a of the insulating tube 50 is opposed to the adhesive agent 60x (FIG. 4B). Subsequently, when the insulating tube 50 is inserted toward the ceramic plate 20, the adhesive agent 60x adheres and spreads between the lower surface 23 of the ceramic plate 20 and the upper surface 50a of the insulating tube 50, and between the inner circumferential surface 34b of the base plate through-hole 34 and the outer circumferential surface 50b of the insulating tube 50 (FIG. 4C). Furthermore, when the insulating tube 50 is inserted toward the ceramic plate 20, the adhesive agent 60x is filled between the lower surface 23 of the ceramic plate 20 and the upper surface 50a of the insulating tube 50, and is raised up between the inner circumferential surface 34b of the base plate through-hole 34 and the outer circumferential surface 50b of the insulating tube 50. When the adhesive agent 60x is hardened in this state, the insulating tube 50 is fixed to the ceramic plate 20 and the base plate 30 via the resin-containing adhesive layer 60. In this manner, the wafer placement table 10 is obtained (FIG. 4D).

Next, a use example of thus configured wafer placement table 10 will be described. First, in a state where the wafer placement table 10 is installed in a chamber (not illustrated), the wafer W is placed on the wafer placement surface 21. The inside of the chamber is decompressed by a vacuum pump, and adjusted to a predetermined degree of vacuum, and a DC voltage is applied to the electrostatic electrode 22 of the ceramic plate 20 to generate an electrostatic attraction force to cause the wafer W to be attracted and fixed to the wafer placement surface 21. Next, a reactive gas atmosphere having a predetermined pressure (e.g., several 10 to several 100 Pa) is attained in the chamber, and in this state, an RF voltage is applied across an upper electrode (not illustrated) provided in the ceiling portion in the chamber and the base plate 30 of the wafer placement table 10 to generate a plasma. The surface of wafer W is processed by the generated plasma. A refrigerant is circulated through the refrigerant flow path 32 of the base plate 30 as appropriate.

When the wafer W is processed by plasma in this manner, heat input by the plasma is removed by the base plate 30, and the wafer placement surface 21 is controlled at a desired temperature. The thickness t of the insulating tube upper surface adhesion part 61 and the height h which is the amount of creep of the insulating tube outer circumferential surface adhesion part 62 may vary with product (the wafer placement table 10). It is preferable that even when the thickness t and the height h vary like this, the temperature immediately above the power supply member do not significantly vary with product, specifically, the temperature difference ΔT obtained by subtracting the outer circumferential temperature from the temperature immediately above the power supply member do not significantly vary with product. In the embodiment, this point is achieved by reducing the thermal conductivity of the insulating tube 50 to 10 W/mK or less. Note that the measurement points for the temperature immediately above the power supply member and the outer circumferential temperature are as shown in FIG. 3. The outer circumferential temperature is relatively stable regardless of the product.

FIGS. 5A to 5F are graphs showing the relationship between thickness t and temperature difference ΔT and the relationship between height h and temperature difference ΔT when the thermal conductivity of the resin-containing adhesive layer 60 is fixed to 2.2 W/mK and the thermal conductivity of the insulating tube 50 is variously changed. Regarding the material, alumina (with a thermal conductivity of 30 W/mK) for the ceramic plate 20, Ti (with a thermal conductivity of 17.5 W/mK) for the base plate 30, silicone resin (with a thermal conductivity of 0.2 W/mK) for the bonding layer 40, an alumina filler-containing silicone resin (with a thermal conductivity of 2.2 W/mK) for the resin-containing adhesive layer 60, and Mo (with a thermal conductivity of 138 W/mK) and Cu (with a thermal conductivity of 398 W/mK) for the power supply member 70 are used. It is assumed that the space inside the base plate through-hole 34 is filled with the atmosphere (with a thermal conductivity of 0.024 W/mK). For the relationship between the thickness t and the temperature difference ΔT, the height h is uniformly set to 6.3 mm, and for the relationship between the height h and the temperature difference ΔT, the thickness t is uniformly set to 0.025 mm. The thermal conductivity of the insulating tube 50 is 30 W/mK in FIG. 5A, 10 W/mK in FIG. 5B, 5 W/mK in FIG. 5C, 3 W/mK in FIG. 5D, 2 W/mK in FIG. 5E, and 0.3 W/mk in FIG. 5F. For example, as the material for the insulating tube 50, with a thermal conductivity of 2 W/mk in FIG. 5E, zirconia ceramic is used.

As seen from the graph of FIGS. 5A to 5F, the variation in the temperature difference ΔT for the thickness t, and the variation in the temperature difference ΔT for the height h can be further reduced when the thermal conductivity of the insulating tube 50 is less than or equal to 10 W/mK (particularly, less than or equal to 5 W/mk) than when the thermal conductivity of the insulating tube 50 is less than or equal to 30 W/mK. Note that in FIG. 5B to FIG. 5F, the thermal conductivity of the insulating tube 50 is less than or equal to 10 times the thermal conductivity of the resin-containing adhesive layer 60.

FIGS. 6A to 6C are graphs showing the relationship between thickness t and temperature difference ΔT and the relationship between height h and temperature difference ΔT when the thermal conductivity of the resin-containing adhesive layer 60 is fixed to 0.2 W/mK, and the thermal conductivity of the insulating tube 50 is variously changed. The materials are the same as those in FIGS. 5A to 5F except that the resin-containing adhesive layer 60 is made of silicone resin (with a thermal conductivity of 0.2 W/mK). For the relationship between thickness t and temperature difference ΔT, the height h is uniformly set to 6.3 mm, and for the relationship between height h and temperature difference ΔT, the thickness t is uniformly set to 0.026 mm. The thermal conductivity of the insulating tube 50 is 30 W/mK in FIG. 6A, 2 W/mK in FIG. 6B, and 0.3 W/mk in FIG. 6C. For example, as the material for the insulating tube 50, with a thermal conductivity of 0.3 W/mK in FIG. 6C, PEEK may be mentioned. In FIGS. 6A to 6C, the same tendency as in FIGS. 5A to 5F is observed in the variation in the temperature difference ΔT for the thickness t, and the variation in the temperature difference ΔT for the height.

In the wafer placement table 10 described in detail above, the thermal conductivity of the insulating tube 50 is less than or equal to 10 W/mK. In contrast, the thermal conductivity of the resin-containing adhesive layer 60 that fixes the insulating tube 50 is low because the resin-containing adhesive layer 60 contains resin. Thus, the difference between the thermal conductivity of the insulating tube 50 and the thermal conductivity of the resin-containing adhesive layer 60 is not significantly large. As a result, for example, even if the thickness t of the insulating tube upper surface adhesion part 61 of the resin-containing adhesive layer 60 varies with product, or the height h of the insulating tube outer circumferential surface adhesion part 62 of the resin-containing adhesive layer 60 varies with product, variation in the temperature of part of the wafer placement surface 21 depending on product can be prevented, the part being immediately above (immediately above the power supply member) the central axis of the insulating tube 50.

The thermal conductivity of the resin-containing adhesive layer 60 is preferably less than or equal to 5 W/mK. In this setting, the difference between the thermal conductivity of the insulating tube 50 and the thermal conductivity of the resin-containing adhesive layer 60 can be sufficiently reduced.

In addition, the thermal conductivity of the insulating tube 50 is preferably less than or equal to 10 times the thermal conductivity of the resin-containing adhesive layer 60. In this setting, the difference between the thermal conductivity of the insulating tube 50 and the thermal conductivity of the resin-containing adhesive layer 60 can be sufficiently reduced.

Furthermore, the thermal conductivity of the base plate 30 is preferably less than or equal to 50 W/mk, more preferably, 5 to 20 W/mK. In this setting, the effects of the present invention are easily obtained.

As preferred combinations of the material for the insulating tube 50 and the material for the resin-containing adhesive layer 60, the combination of zirconia ceramic for the insulating tube 50 and silicone resin with filler (e.g., alumina) contained for the resin-containing adhesive layer 60, and the combination of PEEK for the insulating tube 50 and silicone resin for the resin-containing adhesive layer 60 may be mentioned. In this setting, the difference between the thermal conductivity of the insulating tube 50 and the thermal conductivity of the resin-containing adhesive layer 60 is very small, thus the effects of the present invention are easily obtained. Note that the difference between the thermal conductivity of the insulating tube 50 and the thermal conductivity of the resin-containing adhesive layer 60 is preferably less than or equal to 3 W/mK, more preferably, less than or equal to 1 W/mK.

Note that the present invention is not limited to the above-described embodiment at all, and it is needless to say that the present invention can be carried out in various forms as long as the forms belong to the technical scope of the present invention.

In the above-described embodiment, a resin adhesive layer has been illustrated as the bonding layer 40, however, is not limited thereto. For example, a metal bonding layer may be used as the bonding layer 40. The metal bonding layer can be formed by well-known TCB (Thermal compression bonding) using a metal bonding material (e.g., Al—Mg based bonding material or Al—Si—Mg based bonding material).

In the above-described embodiment, the electrostatic electrode 22 is built in the ceramic plate 20, however, is not limited thereto. For example, in substitution for or in addition to the electrostatic electrode 22, a heater electrode (resistance heating element) may be built in or an (RF) electrode for plasma generation may be built in.

Figure 7:
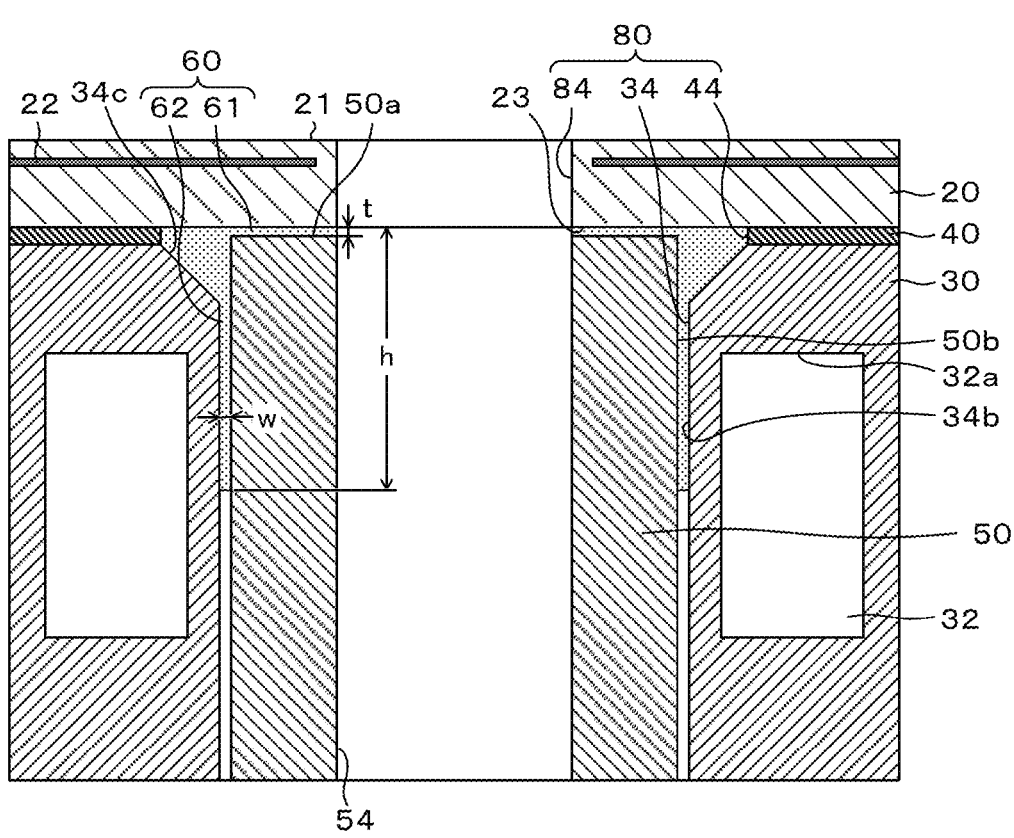
FIG. 7 is a partially enlarged cross-sectional view of another embodiment.

In the above-described embodiment, the base plate through-hole 34 is configured as the power supply member insertion hole, but is not limited thereto. For example, the base plate through-hole 34 may be configured as a lift pin hole, or configured as a gas hole. In this case, the power supply member 70 is not inserted into the base plate through-hole 34. The lift pin hole is a hole that penetrates the wafer placement table 10 in an up-down direction for inserting a lift pin to vertically move the wafer W with respect to the wafer placement surface 21. For example, when the wafer W is supported by three lift pins, three lift pin holes are provided. The gas hole is a hole that penetrates the wafer placement table 10 in an up-down direction to supply gas (e.g., He gas) to the wafer placement surface 21. FIG. 7 is an example in which the base plate through-hole 34 is used as part of the gas hole 80. The gas hole 80 includes the base plate through-hole 34, the bonding layer through-hole 44 and the ceramic plate through-hole 84. A ceramic plate through-hole 84 penetrates the ceramic plate 20 and the electrostatic electrode 22 in an up-down direction so as to be coaxial with the base plate through-hole 34. The electrostatic electrode 22 is not exposed to the inner circumferential surface of the ceramic plate through-hole 84. In FIG. 7, the same components as in the above-described embodiment are labeled with the same symbol. The lift pin hole can also be provided in the same manner as for the gas hole 80.

In the above-described embodiment, the resin-containing adhesive layer 60 includes both the insulating tube upper surface adhesion part 61 and the insulating tube outer circumferential surface adhesion part 62; however, the resin-containing adhesive layer 60 may include one of the insulating tube upper surface adhesion part 61 or the insulating tube outer circumferential surface adhesion part 62.

International Application No. PCT/JP2023/036981, filed on Oct. 12, 2023, is incorporated herein by reference in its entirety.

What is claimed is:

1. A member for semiconductor manufacturing apparatus, comprising:

a ceramic plate having a wafer placement surface on an upper surface and a built-in electrode;

a base plate provided on a lower surface of the ceramic plate, and configured to include built-in refrigerant flow paths;

a through-hole that penetrates the base plate in an up-down direction;

an insulating tube inserted into the through-hole; and a resin-containing adhesive layer provided at least one of between an upper surface of the insulating tube and a lower surface of the ceramic plate or between an outer circumferential surface of the insulating tube and an inner circumferential surface of the through-hole, and configured to fix the insulating tube, wherein the insulating tube is made of ceramic, and a thermal conductivity of the insulating tube is less than or equal to 10 W/mK, and wherein the difference between the thermal conductivity of the insulating tube and the thermal conductivity of the resin-containing adhesive layer is less than 3 W/mK.

2. The member for semiconductor manufacturing apparatus according claim 1, wherein a thermal conductivity of the resin-containing adhesive layer is less than or equal to 5 W/mK.

3. The member for semiconductor manufacturing apparatus according to claim 1, wherein the thermal conductivity of the insulating tube is less than or equal to 10 times the thermal conductivity of the resin-containing adhesive layer.

4. The member for semiconductor manufacturing apparatus according to claim 1, wherein a thermal conductivity of the base plate is less than or equal to 50 W/mK.

5. The member for semiconductor manufacturing apparatus according to claim 1, wherein the insulating tube is comprised of zirconia ceramic.

6. The member for semiconductor manufacturing apparatus according to claim 1, wherein the resin-containing adhesive layer is comprised of a silicone resin.

7. The member for semiconductor manufacturing apparatus according to claim 1, wherein the resin-containing adhesive layer further contains a filler.

8. The member for semiconductor manufacturing apparatus according to claim 1, wherein the base plate through-hole is a power supply member insertion hole into which a power supply member to provide electric power to the built-in electrode is inserted, the power supply member insertion hole being provided downward from the electrode in the member for semiconductor manufacturing apparatus, or part of a lift pin hole which penetrates the member for semiconductor manufacturing apparatus in an up-down direction, and into which a lift pin is inserted, or part of a gas hole that penetrates the member for semiconductor manufacturing apparatus in an up-down direction to supply gas to the wafer placement surface.

9. The member for semiconductor manufacturing apparatus according to claim 1, wherein the base plate comprises a titanium containing metal, a titanium containing metal alloy, or a titanium containing composite material, and wherein the titanium containing metal or metal alloy is pure Ti or α-β Ti alloy.

10. The member for semiconductor manufacturing apparatus according to claim 7, wherein the filler is alumina or aluminum nitride.

11. The member for semiconductor manufacturing apparatus according to claim 1, wherein a thickness (t) of the resin-containing adhesive layer between the upper surface of the insulating tube and the lower surface of the ceramic plate is from 0.01 mm to 0.1 mm.

12. The member for semiconductor manufacturing apparatus according to claim 1, wherein a height (h) of the resin-containing adhesive layer between the outer circumferential surface of the insulating tube and the inner circumferential surface of the through hole is from 3 mm to 10 mm.

13. The member for semiconductor manufacturing apparatus according to claim 1, wherein a thickness (w) of the resin-containing adhesive layer between the outer circumferential surface of the insulating tube and the inner circumferential surface of the through hole is from 0.1 mm to 0.3 mm.

\* \* \* \* \*